United States Patent [19]
Naeem et al.

[11] Patent Number: 6,066,566
[45] Date of Patent: *May 23, 2000

[54] HIGH SELECTIVITY COLLAR OXIDE ETCH PROCESSES

[75] Inventors: Munir-ud-Din Naeem, Poughkeepsie; Matthew J. Sendelbach, Wappingers Falls, both of N.Y.; Ting-Hao Wang, Round Rock, Tex.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/014,805

[22] Filed: Jan. 28, 1998

[51] Int. Cl.⁷ .................... H01L 21/00; H01L 21/3065
[52] U.S. Cl. .................. 438/700; 706/712; 706/723; 706/724
[58] Field of Search .................... 438/700, 712, 438/706, 723, 724

[56] References Cited

U.S. PATENT DOCUMENTS

| | | | |
|---|---|---|---|
| 5,118,384 | 6/1992 | Harmon et al. | 438/717 |
| 5,314,575 | 5/1994 | Yanagida | 156/651 |
| 5,338,399 | 8/1994 | Yanagida | 156/662 |
| 5,468,339 | 11/1995 | Gupta et al. | 216/67 |
| 5,468,340 | 11/1995 | Gupta et al. | 216/67 |
| 5,474,953 | 12/1995 | Shimizu et al. | 437/67 |
| 5,521,114 | 5/1996 | Rajeevakumar | 437/60 |
| 5,543,348 | 8/1996 | Hammerl et al. | 257/386 |
| 5,585,280 | 12/1996 | Kwasnick et al. | 437/4 |
| 5,594,682 | 1/1997 | Lu et al. | 365/149 |
| 5,656,535 | 8/1997 | Ho et al. | 438/386 |
| 5,670,805 | 9/1997 | Hammerl et al. | 257/301 |

*Primary Examiner*—Benjamin L. Utech
*Assistant Examiner*—Lynette T. Umez-Eronini
*Attorney, Agent, or Firm*—Steven Capella

[57] ABSTRACT

A collar oxide is formed in a provided a semiconductor substrate having (3) a partially full trench, (2) (i) fill surface defined by fill material partially filling said trench, (ii) upper surface outside of said trench, and (iii) trench sidewall surface not covered by said fill material, and (3) a conformal oxide layer overlying said fill, upper, and sidewall surfaces, by selectively etching as follows:

(a) contacting the substrate with a mixture of hydrogen-containing fluorocarbon and an oxygen source under reactive ion etching conditions until at least a portion of the conformal oxide layer on the upper surface is removed, and (b) contacting the substrate from step (a) with a mixture of a hydrogen-free fluorocarbon and a diluent gas under reactive ion etching conditions to further remove conformal oxide remaining on the fill surface and to overetch the upper and fill surfaces, whereby a substantial portion of conformal oxide remains on the side walls to form the collar oxide.

A further step (c) may be added after the overetching to remove any residual byproduct polymer deposits. The methods are especially adapted for use in the manufacture of high aspect ratio trench capacitors for integrated circuits. The method provides reduced degradation of pad nitride layers and may be conducted without the use of CO gas.

20 Claims, 6 Drawing Sheets

HIGH SELECTIVITY COLLAR OXIDE ETCH PROCESSES

BACKGROUND OF THE INVENTION

Deep trench capacitors are used as components in dynamic random access memory (DRAM) devices and other integrated circuit devices. In the formation of integrated circuit devices on semiconductor wafers (chips), there is a continual desire to increase the number of devices per unit area of the chip surface. To meet this demand for increased device density, continual efforts are made to reduce the surface area taken up by device components such as capacitors. Trench capacitors having geometries involving high aspect ratios (depth normal to the principal wafer surface width parallel to the principal wafer surface) allow more capacitors can be placed on the chip.

The general fabrication of trench capacitors and other trench-based component is well known. Typical processes involve etching of an initial trench into the substrate (or wafer, usually a silicon wafer). Prior to trench etching, one or more conformal dielectric material layers may be formed on the wafer surface. Typically, a conformal oxide dielectric layer will be closest to the semiconductor surface with a conformal nitride dielectric layer (so-called "pad nitride") overlying the oxide layer. The trench is then formed by etching through the pad dielectric layers and into the semiconductor substrate material. A region in the substrate at the bottom of the trench may be doped to provide a region of increased charge storage capacity which will become one plate of the capacitor. A thin node dielectric layer (high dielectric constant material) is formed as a conformal layer covering the trench surface. The trench is then filled with a doped polycrystalline silicon (polysilicon) or other charge storage material to form the other plate of the capacitor.

In order to enhance the reliability of the trench capacitor design by minimizing parasitic leakage at the trench sidewalls, a "collar" oxide may be formed about the upper inside surface of the trench. The formation of the collar oxide itself is a fairly complicated process. Typically, the top portion of the filled trench must be etched back leaving the dielectric layer along the upper portion of the trench sidewalls exposed. A conformal oxide layer (or typically a precursor thereof) is then deposited. The portion of the conformal oxide layer on the surface of the polysilicon (or other charge storage material) remaining in the partially filled trench is then selectively removed while leaving oxide about the upper sidewall of the trench to serve as a collar oxide. In the process of removing the conformal oxide from the polysilicon surface, the portion of this conformal oxide layer outside the trench (i.e. overlying the pad nitride) is also removed. The unfilled portion of the trench is then refilled with polysilicon to complete the formation of the capacitor plate with the collar oxide residing near the upper end of the trench.

This selective removal of the conformal oxide is a key step in trench capacitor fabrication. If the oxide is not completely removed from the polysilicon (or other fill material) surface where the trench is to be refilled, the performance of the capacitor may be compromised due to poor electrical connection between the polysilicon material deep in the trench and the polysilicon material deposited on trench refilling (i.e. in the portion of the trench having the collar oxide along the trench walls). Further, the selective removal of the conformal oxide must not adversely affect the underlying node dielectric layer, the dielectric pad dielectric layer or other features which present on the substrate outside the trench. Protection of the pad nitride layer near the top of the trench is especially important since it is typically used as an etch stop during the subsequent processing of the substrate. These process demands are made more difficult by the continued move to smaller dimension/higher aspect ratio geometries (e.g. 20 or higher).

Typically reactive ion etching or other dry etching processes have been used to achieve the selective removal of the conformal oxide. These processes have exhibited problems of slow etch rate (long process time), formation of undesired by-products/deposits, required use of problematic gases such as CO, and/or lack of reliability resulting in low yields or need for very tight control of process parameters. Thus, there remains a need for improved processes for conformal oxide etching, especially for use in the fabrication of trench capacitors.

SUMMARY OF THE INVENTION

The invention provides improved methods for selective etching of conformal oxide layers. The invention further provides methods for forming a collar oxide in a trench in a semiconductor substrate which process provides improved integrity of pad dielectric layers resulting in improved structural and operational reliability of the resulting devices. The methods of the invention are especially useful in the manufacture of high aspect ratio trench capacitors for integrated circuits and other processes involving high aspect raio oxide etching in the absence of resist.

In one aspect, the invention encompasses a method for forming a collar oxide in a trench in a semiconductor substrate wherein a provided semiconductor substrate having (1) a partially-filled (e.g. filled and etched back) trench, (2) (i) fill surface defined by fill material partially filling the trench, (ii) upper surface outside of the trench, and (iii) trench sidewall surface not covered by the fill material, and (3) a conformal oxide layer overlying the fill, upper, and sidewall surfaces, the method comprising selectively etching the conformal oxide layer by:

(a) contacting the substrate with a mixture of hydrogen-containing fluorocarbon and an oxygen source under reactive ion etching conditions until at least a portion of the conformal oxide layer on the upper surface is removed, and (b) contacting the substrate from step (a) with a mixture of a hydrogen-free fluorocarbon and a diluent gas under reactive ion etching conditions to further remove conformal oxide remaining on the fill surface and to overetch the upper and fill surfaces, whereby a substantial portion of conformal oxide remains on the side walls to form the collar oxide.

Preferably, the conformal oxide is completely removed from the upper surface in step (a). A further step (c) may be added after the overetching to remove any residual byproduct polymer deposits. The method of the invention may be practiced without the use of gases such as CO.

The trench having the formed collar oxide may then be further filled with an additional portion of the fill material and/or may be subjected to other processing steps for forming an electrically functioning structure such as a capacitor. Doped polysilicon is a preferred fill material. The method of the invention is especially useful where some or all of the upper surface of the substrate comprises a pad dielectric layer such as silicon nitride. The method of the invention is also especially useful in the manufacture of trench devices having a high trench (depth to width) aspect ratio.

These and other aspects of the invention are described in further detail below.

DETAILED DESCRIPTION OF THE INVENTION

The invention generally relates to improved methods for selective removal of portions of conformal oxide layers. The methods of the invention are especially useful in the formation of collar oxides for semiconductor substrate trenches such as those used to form trench capacitors and for other high aspect ratio etching applications. The figures schematically illustrate the basic structure of the trench capacitor. It should be understood that none of the drawings in the present application is necessarily to scale.

The invention is not limited to any specific method of trench formation. General techniques for forming trench capacitors having collar oxide features are known in the art. See for example the methods disclosed in U.S. Pat. Nos. 4,794,434; 5,283,453; 5,434,109; 5,656,535; and 5,677,219, the disclosures of which are incorporated herein by reference. A typical method is trench formation method is described below.

Figure 1:
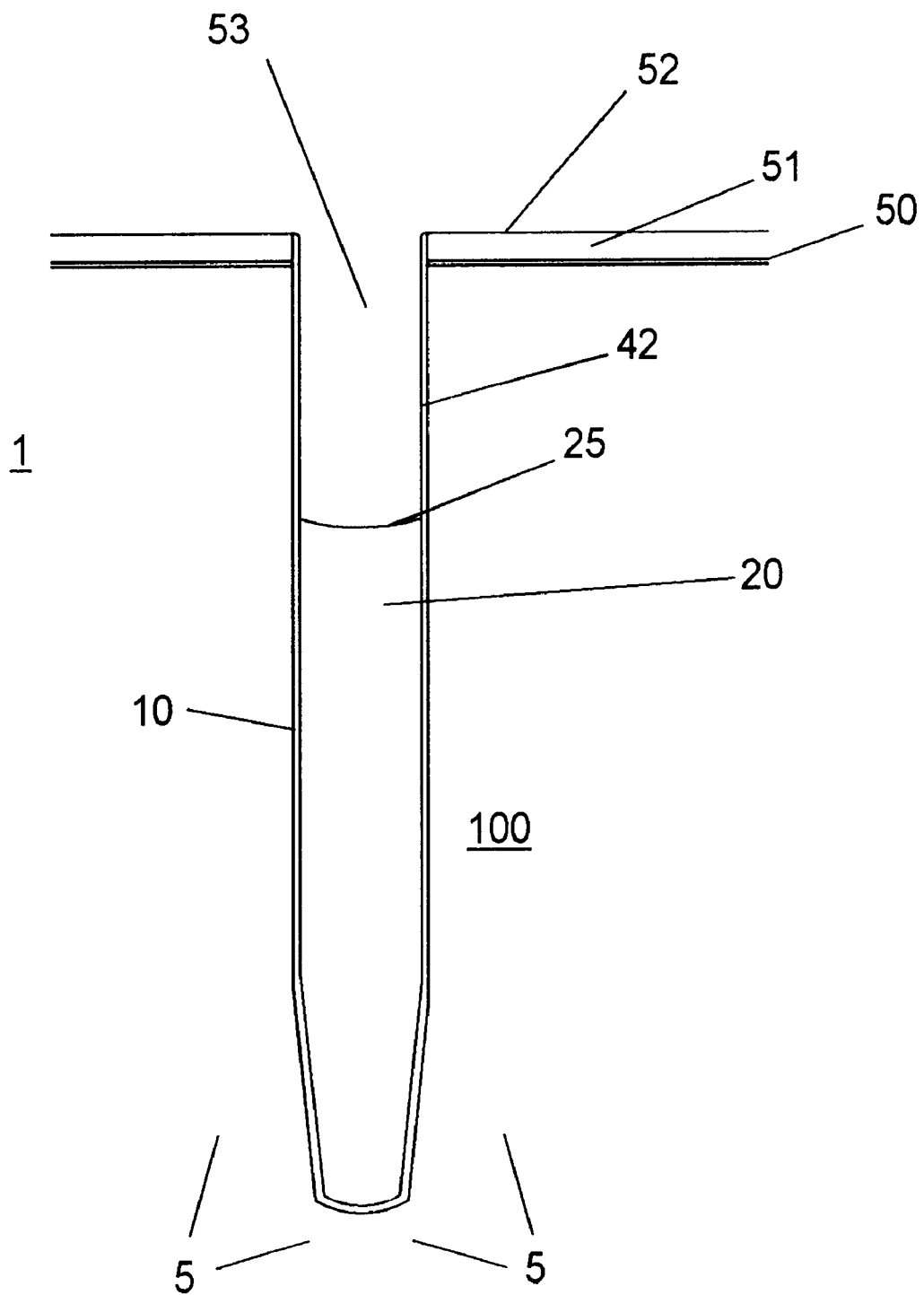
FIG. 1 is a schematic cross section view of a high aspect ratio trench after formation of thin node dielectric layer and filling with charge storage fill material and partial etch back of the fill material.

Referring to FIG. 1, typical fabrication of trench capacitors involves first coating the wafer or substrate 1 with one or more conformal pad dielectric layers, usually an oxide layer 50 followed by a nitride layer 51. A trench 100 is then etched an into the substrate 1. The trench etching is usually performed by applying a TEOS (tetraethyl orthosilicate) hard mask layer (not shown) over the uppermost pad dielectric layer. A patterned photoresist layer (not shown) is then formed over the hard mask layer. The hard mask is then patterned by selectively etching. Then, the remaining photoresist layer is typically stripped and the trench is formed by anisotropic etching through the pad dielectric layers 50, 51 and a portion of the semiconductor substrate 1 to form the desired trench 100. The hard mask oxide is then removed. Regions 5 in the substrate near the wall of the trench may be doped to provide a region of increased charge storage capacity which will become one plate of the capacitor. A thin node dielectric layer 10 is formed as a conformal layer covering the trench surface. After formation of the node dielectric 10, the trench 100 is then filled with a charge storage material 20 (typically a doped polysilicon) which is then etched back leaving a fill surface 25.

Figure 2:
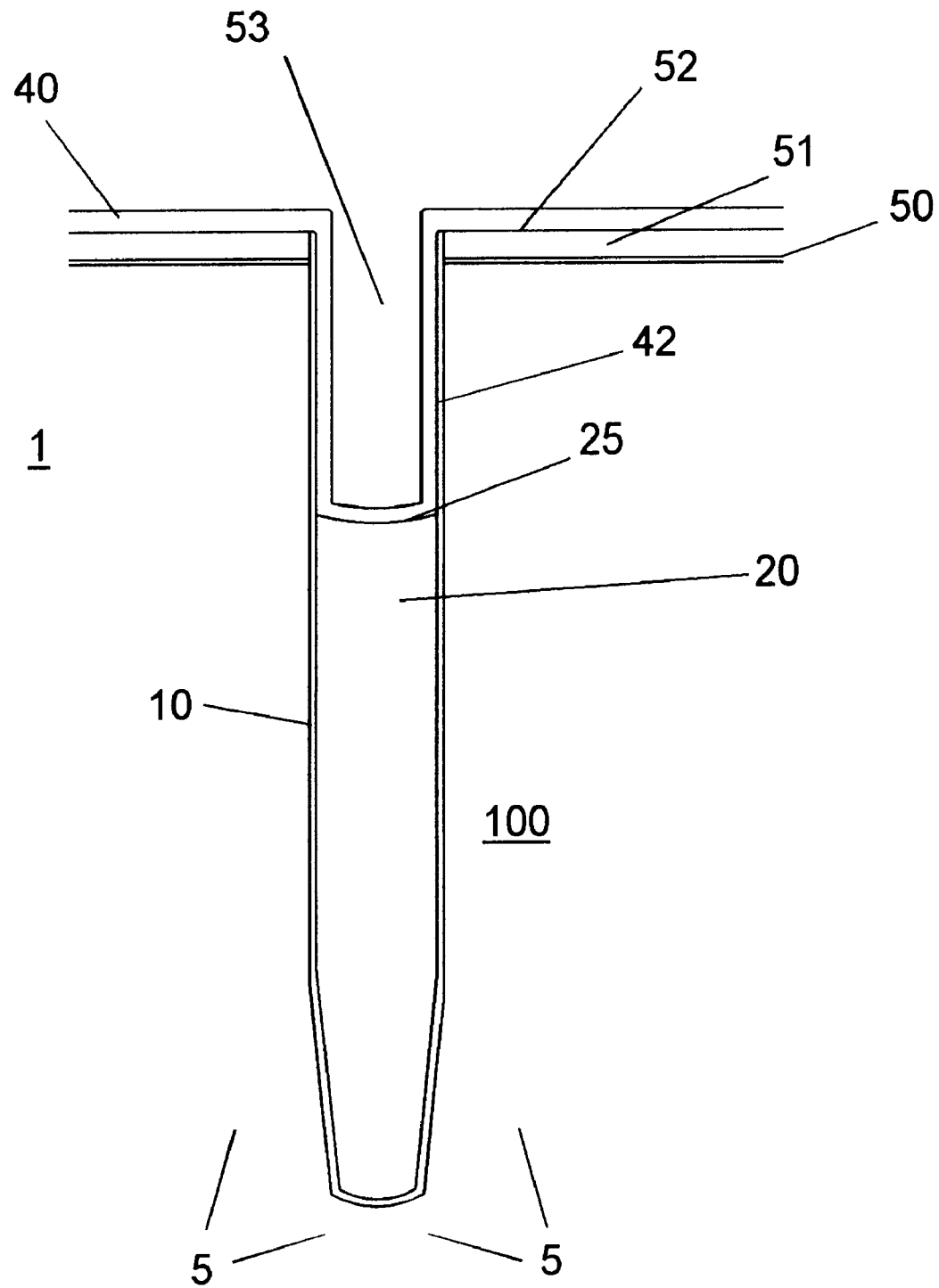
FIG. 2 is a schematic cross section view of the trench of FIG. 1 with the application of a conformal oxide layer.

To form the collar oxide, a conformal oxide layer 40 (FIG. 2) or typically a precursor thereof is then deposited over the trench, thus covering the fill surface 25, the upper sidewalls 42 and the top surface 52 (e.g. the surface of uppermost pad dielectric 51). The portion of the conformal oxide layer on the fill surface 25 and the top surface must then be selectively removed while leaving oxide about the upper sidewall of the trench to serve as a collar oxide. The conformal oxide must also be removed from the dielectric features 50 on the substrate surface outside the trench. The upper portion 53 of the trench is then refilled with additional charge storage material (FIG. 6) to complete the formation of the capacitor plate with the collar oxide 41 residing near the upper end of the trench.

Where the method of the invention is used in the context of trench geometries on semiconductor substrates, the method preferably starts with a provided a semiconductor substrate having (1) a partially-filled (e.g. filled and etched back) trench, (2) (i) fill surface defined by fill material partially filling the trench, (ii) upper surface outside of the trench, and (iii) trench sidewall surface not covered by the fill material, and (3) a conformal oxide layer overlying the fill, upper, and sidewall surfaces. The method of the invention then preferably involves removing a portion of the conformal oxide by selective etching, the etching comprising:

(a) contacting the substrate with a mixture of hydrogen-containing fluorocarbon and an oxygen source under reactive ion etching conditions until at least a portion of the conformal oxide layer on the upper surface is removed, and (b) contacting the substrate from step (a) with a mixture of a hydrogen-free fluorocarbon and a diluent gas under reactive ion etching conditions to further remove conformal oxide remaining on the fill surface and to overetch the upper and fill surfaces, whereby a substantial portion of conformal oxide remains on the sidewall surfaces to form the collar oxide.

Preferably, the conformal oxide is completely removed from the upper surface in step (a). A further step (c) may be added after the overetching to remove any residual byproduct polymer deposits.

The starting structure having a conformal oxide layer over a partially filled trench may be formed by any conventional means such as those described in the above mentioned US patents. Preferably, the conformal oxide is formed using a tetraethylorthosilicate (TEOS) chemical vapor deposition (CVD) technique which results in a conformal $SiO_2$ layer. The invention is not limited to any specific collar oxide composition.

As noted above, the upper surface of the substrate preferably has one or more pad dielectric layers applied prior to trench formation which underlie the conformal oxide coating deposited over the partially full trench. Preferably the uppermost pad dielectrics is a nitride such as silicon nitride or silicon oxynitride. Where the structure is to be used as a capacitor, the material partially filling the trench (and thereby forming the fill surface) is preferably a material capable of holding and discharging electrical charge. Preferred fill materials are doped polysilicons (polycrystalline silicon) such as are commonly used in the formation of trench capacitors.

The method of the invention is not limited to any specific trench geometry or aspect ratio. The method is especially useful, however, for trench capacitors having an aspect ratio (depth:width) of at least about 5, more preferably at least about 20, wherein the trench depth is measured from the semiconductor surface at the trench entrance in the direction normal to the semiconductor surface. The trench width is measured as the maximum width in the trench in a direction parallel this the semiconductor surface. The invention is not limited to any specific trench dimensions or layer thicknesses.

Both etching steps (a) and (b) of the present invention preferably involve the removal of a portion of the conformal oxide applied over a partially full trench.

In step (a), the substrate is contacted with a mixture of hydrogen-containing fluorocarbon and an oxygen source under reactive ion etching conditions until at least a portion of the conformal oxide layer on the upper surface is removed.

The hydrogen-containing fluorocarbon gas is preferably consists of C, H and F atoms, more preferably the hydrogen-containing fluorocarbon gas is selected from the group consisting of $CHF_3$, $CH_2F_2$, $CH_3F$ and mixtures thereof. Most preferably, the hydrogen-containing fluorocarbon gas consists essentially of $CHF_3$. The oxygen source is preferably selected from the group consisting of diatomic oxygen ($O_2$), oxygen-containing reducing gases such as $CO_2$, CO, and mixtures thereof. A diluent gas such as helium or argon may also be included. $O_2$ is the preferred oxygen source gas from the point of minimizing byproduct polymer formation and other adverse effects. The flow of the hydrogen-containing fluorocarbon is preferably about 40–100 sccm, more preferably about 60–80 sccm. The flow of the oxygen source gas is preferably about 2–15 sccm. Preferably, the use of CO gas is avoided.

The reactive ion etching conditions in step (a) preferably include about 50–150 millitorr operating pressure, about 200–500 watts power, and about 0–90 gauss magnetic field. In some circumstances, it may also be desirable to add a minor flow of a hydrogen-free fluorocarbon such as $C_4F_8$ or $CF_4$ to the overall gas mix. The total flow of such hydrogen-free fluorocarbons in step (a) is preferably about 2–20 sccm.

Chemical detection means are preferably used to monitor the evolution of reaction products associated with reaction of the upper surface layer underlying the conformal oxide layer. Where the upper surface comprises a pad nitride layer, chemical detection means may be used to monitor the evolution of nitrogen-containing reaction products (e.g. CN or $Si_xN_y$ species) or other reaction products (e.g. $Si_xF_y$). Typically, when the conformal oxide completely covers the pad nitride, little or no nitrogen-containing reaction products are detected. On exposure of the pad nitride, the evolution of nitrogen-containing reaction products increases until it reaches a steady state concentration which generally corresponds to complete or nearly complete exposure of the pad nitride (i.e. the nitride surface area exposed for reaction approaches a constant).

Figure 3:
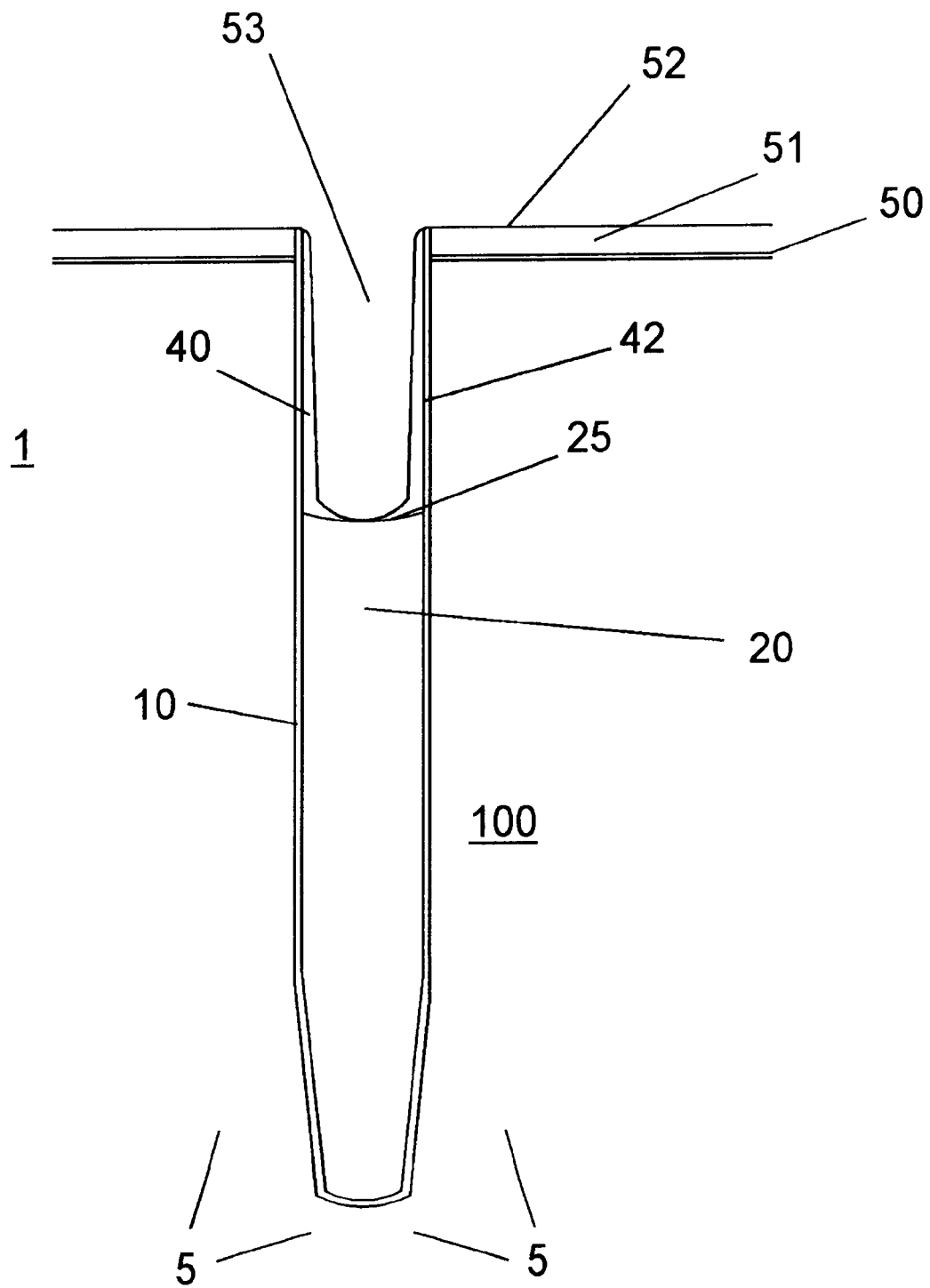
FIG. 3 is a schematic cross section view of the trench of FIG. 2 after removal of the conformal oxide layer from the upper surface of the substrate.

Etching step (a) is preferably carried out at least until a substantial amount of the conformal oxide layer has been removed from the upper surface (e.g. the pad nitride surface), more preferably, at least until the evolution of reaction products associated with reaction of the upper surface (typically nitrogen-containing reaction products) occurs. Most preferably, etching step (a) is continued at least until this steady state concentration the evolution of upper surface reaction products is first reached. This state is schematically illustrated in FIG. 3 where conformal oxide 40 is no longer present above pad dielectric 51. Step (a) may be continued for some time (over-etch) after the steady state is first reached, but, to minimize erosion of the pad nitride, etching step (a) is preferably not carried out for too much time after first reaching the steady state. On the other hand, the switchover to step (b) is preferably not done before a substantial portion of the conformal oxide has been removed from the upper surface, otherwise excessive undesired byproducts may be formed.

Figure 4:
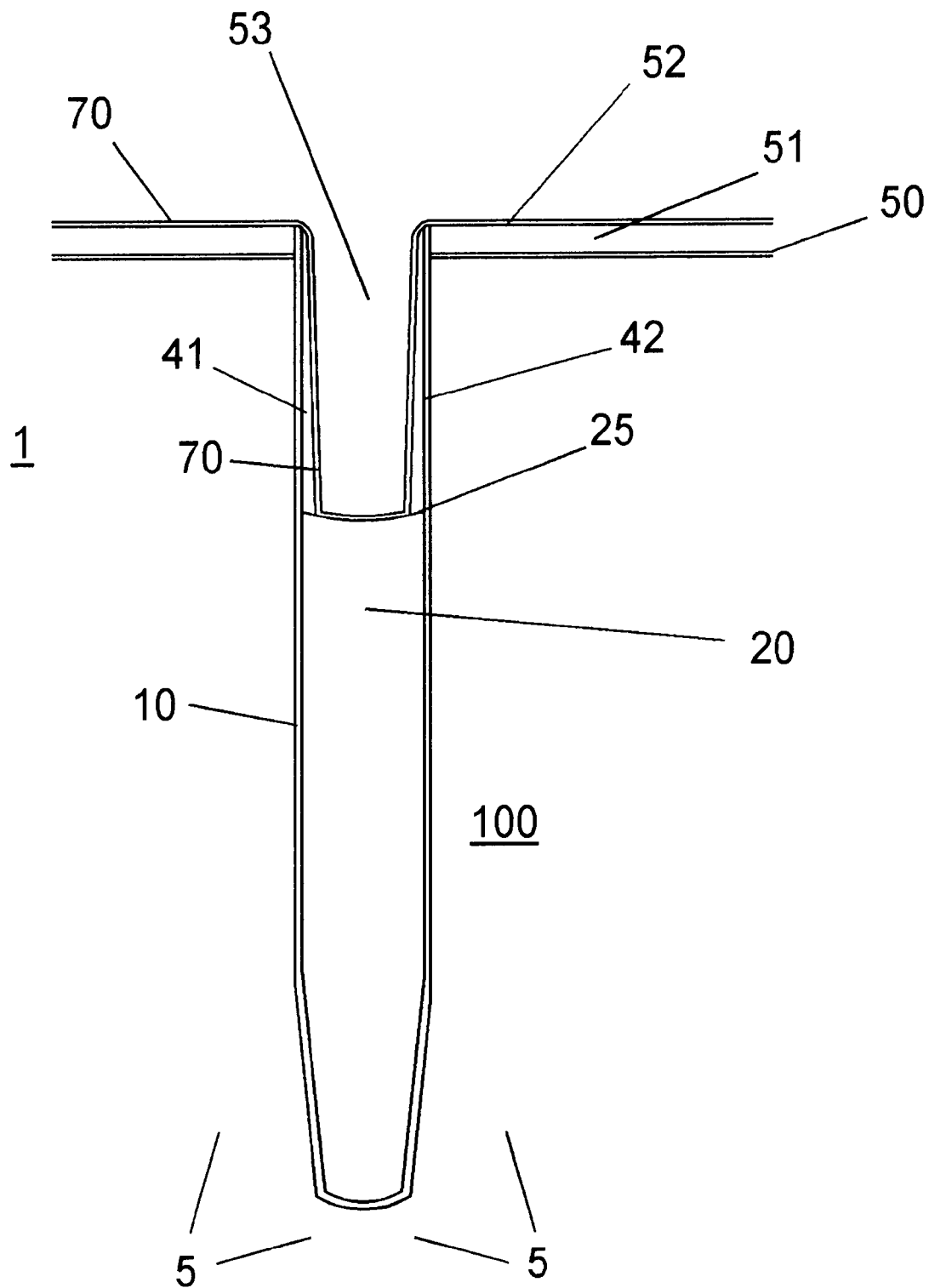
FIG. 4 is a schematic cross section view of the trench of FIG. 3 after further removal of the conformal oxide layer from the fill surface and deposition of residual byproducts.

In step (b), the substrate from step (a) is contacted with a mixture of a hydrogen-free fluorocarbon and a diluent gas under reactive ion etching conditions to further remove conformal oxide remaining on the fill surface 25 and to overetch the upper and fill surfaces, whereby a substantial portion of conformal oxide remains on the sidewalls to form the collar oxide. The etchant mixture in step (b) preferably etches oxide very selectively without substantial degradation of the pad nitride or the trench fill material. As shown in FIG. 4, the etching of the oxide at the fill surface 25 is preferably highly anisotropic such that the profile of the conformal oxide 41 on the sidewall is projected directly down to the fill surface 25 and a substantially clean (i.e. conformal oxide-free) fill surface away from the sidewall conformal oxide 41 are obtained. In step (b), polymer byproducts may be deposited on the etched surfaces. These byproducts are shown generally as layer 70.

The hydrogen-free fluorocarbon is preferably a fluorocarbon having a C:F atomic ratio of at least about 0.33, more preferably at least about 0.5. Examples of preferred hydrogen-free fluorocarbons are disclosed in U.S. Pat. No. 5,338,399, the disclosure of which is incorporated herein by reference. Cyclic $C_4F_8$ is most preferred. The diluent may be any gas which does not have an adverse affect on the performance of the hydrogen-free fluorocarbon or the overall etching operation. Preferred diluents are noble gases such as Ar, He, and Xe, most preferably Ar. Other gases such as $N_2$ can also be used as a diluent. The flow of hydrogen-free fluorocarbon is preferably about 3–20 sccm. The flow of diluent gas is preferably about 50–300sccm. The gas mixture used in step (b) may contain a minor amount of other fluorine compound gas such as hydrogen-containing fluorocarbons or $SF_6$, however, the molar ratio (or volume ratio at constant pressure) of hydrogen-free fluorocarbon to hydrogen-containing fluorocarbon is greater in step (b) than in step (a). Preferably, the use of CO gas is avoided. The reactive ion etching conditions in step (b) preferably include about 25–200 millitorr operating pressure, about 500–1200 watts power, and about 0–90 gauss magnetic field. The step (b) etching process is preferably conducted until the oxide is completely removed at fill surface 25 with the exception of the vertical projection (i.e. substantially normal to the fill surface) of sidewall oxide 41 as shown in FIG. 4. Preferably, step (b) is conducted for not more than twice the time used in step (a), more preferably for about 50–100% of the time used in step (a).

Figure 5:
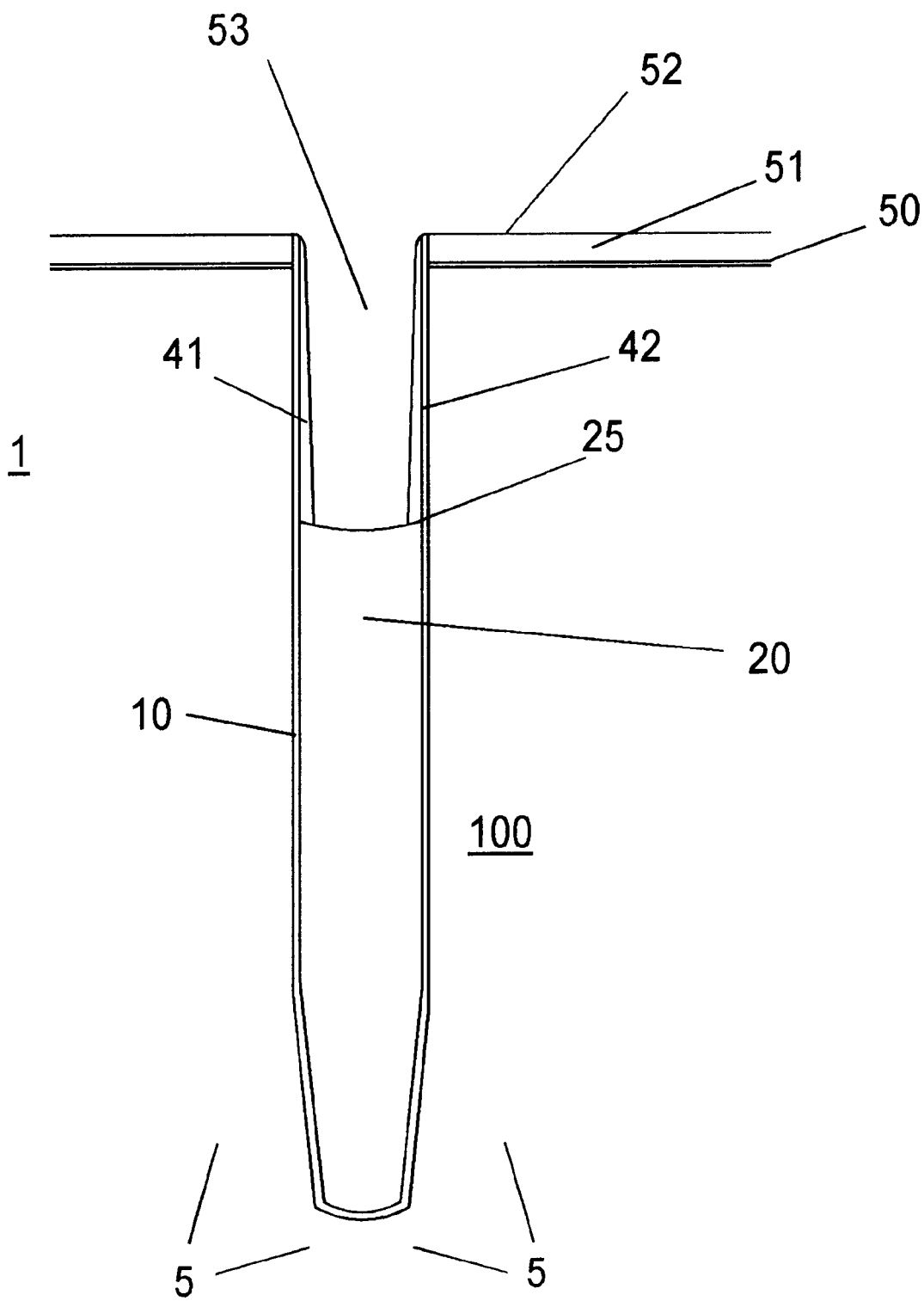
FIG. 5 is a schematic cross section view of the trench of FIG. 4 after further removal of the residual byproducts.

Typically, etching step (b) will result in the formation of a polymer byproduct deposit 70 (FIG. 4) on the substrate. The deposited polymer is preferably removed in a cleaning step (c) before further processing of the substrate. This removal results in a clean surface as schematically illustrated in FIG. 5. The cleaning step (c) preferably involves contacting the substrate from step (b) with a gas containing at least one component adapted to facilitate removal of the polymer byproduct, more preferably a gas component selected from the group consisting of $NF_3$, $CF_4$, $O_2$, or mixtures thereof. The gas component is most preferably $CF_4$. For $NF_3$, the flow rate is preferably about 2–100 sccm, more preferably about 10–100 sccm. For $CF_4$, the flow rate is preferably about 10–200 sccm. For $O_2$, the flow rate is preferably about 10–200 sccm. Preferably, the use of CO gas is avoided. Preferably, diluent gases such as Ar, He, $N_2$, or Xe is used in combination with the above mentioned gases. The cleaning is preferably conducted under conditions which preferably include about 25–300 millitorr operating pressure, about 50–300 watts power, and about 0–90 gauss magnetic field. The cleaning step is preferably performed for about 1–100 seconds.

The etching processes of the invention may be performed in any conventional etching apparatus normally used for reactive ion etching of oxides. A preferred etching apparatus is model AME MXP+ sold by Applied Materials Inc.

Figure 6:
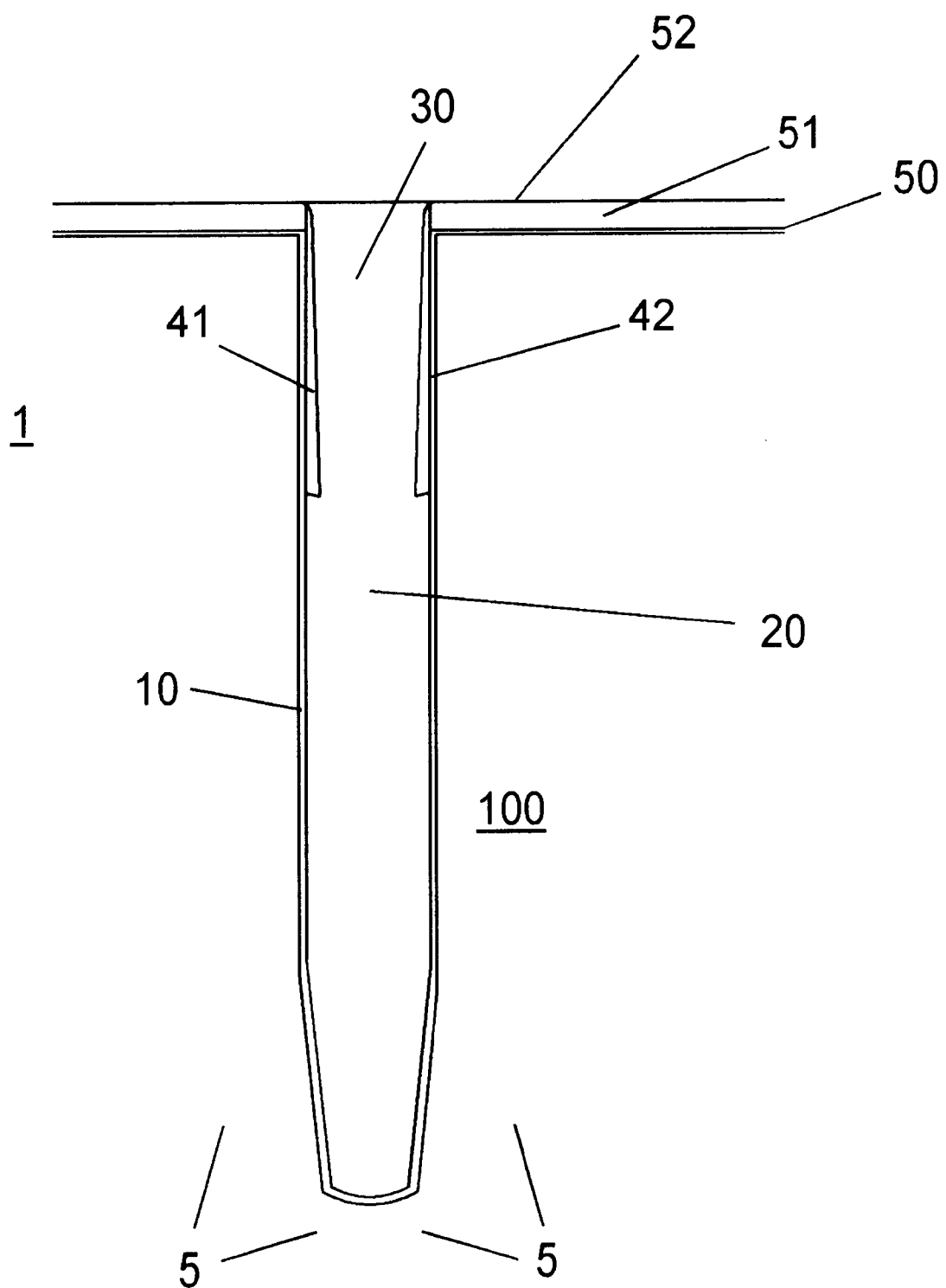
FIG. 6 is a schematic cross section view of the trench of FIG. 5 after filling with additional fill material.

Once the cleaned, etched structure is obtained with the desired collar oxide and clean fill surface, the trench may be refilled with an additional amount 30 of charge storage material as shown in FIG. 6. Such filling techniques are well known in the art. Alternatively, the structure may be subjected to other manufacturing processes as may be desired.

What is claimed is:

1. A method of forming a collar oxide in a provided a semiconductor substrate having the substrate having (1) a partially full trench, (2) (i) fill surface defined by fill material partially filling said trench, (ii) upper surface outside of said trench, and (ill) trench sidewall surface not covered by said fill material, and (3) a conformal oxide layer overlying said fill, upper, and sidewall surfaces, said method comprising selectively etching said conformal oxide by:

(a) contacting said substrate with a mixture containing hydrogen-containing fluorocarbon and an oxygen source gas under reactive ion etching conditions until at least a portion of conformal oxide on said upper surface is removed, said mixture of step (a) optionally containing hydrogen-free fluorocarbon, and (b) contacting the substrate from step (a) with a mixture containing a hydrogen-free fluorocarbon and a diluent gas under reactive ion etching conditions to further remove conformal oxide remaining on said Fill surface and to overetch said upper and fill surfaces, said mixture of step (b) optionally containing a hydrogen-containing fluorocarbon, wherein said mixture of step (b) has a higher molar ratio of hydrogen-free fluorocarbon to hydrogen-containing fluorocarbon compared to the mixture of step (a), whereby a substantial portion of said conformal oxide remains on said sidewall surface to form said collar oxide.

2. The method of claim 1 wherein said conformal oxide etching further comprises:

(c) contacting said etched substrate from step (b) with a gas containing at least one component selected from the group consisting of $O_2$, $NF_3$, and $CF_4$ to remove any residual polymer deposited on said surfaces during steps (a) and (b).

3. The method of claim 1 wherein at least a portion of said upper surface comprises a nitride composition and said etching in step (a) is conducted until said nitride composition is exposed.

4. The method of claim 1 wherein said mixture in step (a) contains a hydrogen-free fluorocarbon.

5. The method of claim 1 wherein said mixture in step (a) comprises about 40–100 parts by volume of said hydrogen-containing fluorocarbon and about 2–15 parts by volume of said oxygen source gas.

6. The method of claim 5 wherein said reactive ion etching conditions in step (a) include an operating pressure of about 50–150 millitorr and a power of about 200–500 watts.

7. The method of claim 1 wherein said hydrogen-containing fluorocarbon is trifluoromethane.

8. The method of claim 1 wherein said mixture in step (b) comprises about 3–20 parts by volume of said hydrogen-free fluorocarbon and about 50–300 parts by volume of said diluent gas.

9. The method of claim 1 wherein said diluent gas is selected from the group consisting of Ar, He, Xe, $N_2$, and mixtures thereof.

10. The method of claim 8 wherein reactive ion etching conditions in step (b) include an operating pressure of about 25–200 millitorr and a power of about 500–1200 watts.

11. The method of claim 1 wherein said mixture in step (b) comprises a hydrogen-free fluorocarbon having a C/F atomic ratio greater than 0.25.

12. The method of claim 11 wherein said mixture in step (b) comprises a hydrogen-free fluorocarbon having a C/F atomic ratio at least about 0.5.

13. The method of claim 2 wherein said contacting in step (c) is performed at a pressure of about 25–300 millitorr and a power of about 50–300 watts.

14. The method of claim 12 wherein said hydrogen-free fluorocarbon is $C_4F_8$.

15. The method of claim 1 wherein step (b) is conducted for about 0.1–2 times the amount of time taken to conduct step (a).

16. The method of claim 3 wherein said nitride composition comprises a nitride selected from the group consisting of silicon nitride and silicon oxynitride.

17. The method of claim 1 wherein said material partially filling said trench is selected from the group consisting of polysilicon and doped polysilicon.

18. The method of claim 1 wherein said sidewall surface is coated with a high dielectric constant material layer prior to application of said conformal oxide.

19. The method of claim 1 wherein said conformal oxide layer comprises silica.

20. The method of claim 2 wherein said process further comprises filling the trench after step (c) with an additional amount of said fill material.

* * * * *